(12) United States Patent
Aliev et al.

(10) Patent No.: US 9,354,975 B2
(45) Date of Patent: May 31, 2016

(54) LOAD BALANCING ON DISKS IN RAID BASED ON LINEAR BLOCK CODES

(71) Applicant: EMC Corporation, Hopkinton, MA (US)

(72) Inventors: Artem Alexandrovich Aliev, St. Petersburg (RU); Peter Vladimirovich Trifonov, St. Petersburg (RU); Vera Dmitriyevna Miloslavskaya, St. Petersbrg (RU); Alexander Nicholaevich Alexeev, St. Petersburg (RU)

(73) Assignee: EMC Corporation, Hopkinton, MA (US)

( * ) Notice: Subject to any disclaimer, the term of this patent is extended or adjusted under 35 U.S.C. 154(b) by 144 days.

(21) Appl. No.: 14/236,270

(22) PCT Filed: Mar. 15, 2013

(86) PCT No.: PCT/IB2013/001188
§ 371 (c)(1),
(2) Date: Jan. 30, 2014

(87) PCT Pub. No.: WO2014/140676
PCT Pub. Date: Sep. 18, 2014

(65) Prior Publication Data
US 2015/0301896 A1    Oct. 22, 2015

(51) Int. Cl.
| | |
|---|---|
| G11C 29/00 | (2006.01) |
| G06F 11/10 | (2006.01) |
| H03M 13/15 | (2006.01) |
| H03M 13/03 | (2006.01) |
| H03M 13/00 | (2006.01) |
| G06F 11/08 | (2006.01) |

(52) U.S. Cl.
CPC .......... *G06F 11/1096* (2013.01); *G06F 11/085* (2013.01); *H03M 13/036* (2013.01); *H03M 13/15* (2013.01); *H03M 13/611* (2013.01); *H03M 13/616* (2013.01)

(58) Field of Classification Search
CPC ............ G06F 11/1076; G06F 11/1008; G06F 2211/1057; G06F 2211/1028; G06F 2211/1054; G06F 11/1096; G06F 11/085; H03M 13/1515; H03M 13/1575; H03M 13/158; H03M 13/616; H03M 13/6508
See application file for complete search history.

(56) References Cited

U.S. PATENT DOCUMENTS

| | | | |
|---|---|---|---|
| 6,694,479 B1 * | 2/2004 | Murthy ............... | G06F 11/1076 714/758 |
| 2007/0290901 A1 | 12/2007 | Hekstra et al. | |
| 2008/0115017 A1 | 5/2008 | Jacobson | |
| 2008/0183963 A1 | 7/2008 | He et al. | |
| 2009/0132851 A1 * | 5/2009 | Pruthi ................. | G06F 11/1076 714/6.12 |

* cited by examiner

*Primary Examiner* — Guerrier Merant
(74) *Attorney, Agent, or Firm* — BainwoodHuang (57) ABSTRACT

An improved technique involves assigning a different generator matrix to each data stripe of the redundant disk array such that all of the different generator matrices represent the same code. For example, when a k×n generator matrix G represents a linear code C, k being the block length and n the code length, then for any invertible k×k matrix P, the matrix G'=PG is also a generator that represents C. When C is a systematic code, then G consists of a k×k identity matrix representing payload data concatenated with a k×(n−k) parity matrix representing parity data. Certain matrices P represent row operations on G, meaning that the matrix G' may have the columns of the identity matrix in G to different locations in G'.

21 Claims, 5 Drawing Sheets

LOAD BALANCING ON DISKS IN RAID BASED ON LINEAR BLOCK CODES

BACKGROUND

Redundant arrays of inexpensive disks (RAIDs) provide for reliable storage of payload data by storing additional data in some of the disks of the array. The design of a RAID involves ensuring that, if some number of disks fails, then the data stored in those disks may be recovered from other disks in the array.

Some RAIDs apply codes to segments of payload data to create codewords on the disks of an array. In this manner, in the event of a failure, a RAID controller is able to recover the payload data from those codewords. Some codes are maximum-distance separable (MDS) in that such codes allow for recovery of up to r erasures when r parity disks have been set aside for parity data. An example of such an MDS code is a Reed-Solomon code with an alphabet based on $GF(2^m)$, where m is the length of a payload block.

Other codes, however, are non-MDS codes based on alphabets such as $GF(2)$. In these codes, many mathematical operations on codewords may be carried out with XOR operations. In conventional RAID systems that use systematic, non-MDS codes, a storage processor stores parity data and payload data on separate disks and perform partial stripe updates of parity data independently from the payload data.

SUMMARY

Unfortunately, there are deficiencies with the above-described conventional RAID systems that use non-MDS codes. In most storage systems parity data are updated far more frequently than information symbols, causing parity disks to wear more quickly than payload disks. If one could afford the computational overhead of an MDS code, such as used in classical RAID-5 or RAID-6, then cycling mapping of codeword symbols onto disks can be used, which provides disk load balancing. Cyclic mapping, however, is not an option for non-MDS codes because there are some configurations of r erasures which are not recoverable with such codes.

In contrast to the conventional RAID system that use non-MDS codes in which unbalanced loads may cause premature wear on parity disks, an improved technique involves assigning a different generator matrix to each data stripe of the redundant disk array such that all of the different generator matrices represent the same code. For example, when a k×n generator matrix G represents a linear code C, k being the block length and n the code length, then for any invertible k×k matrix P, the matrix G'=PG is also a generator that represents C. When C is a systematic code, then G consists of a k×k identity matrix representing payload data concatenated with a k×(n−k) parity matrix representing parity data. Matrices P represent row operations on G. There exist such matrices P, so that matrix G' may have the columns of the identity matrix in different locations than G.

Advantageously, the improved technique allows for load balancing in non-MDS codes when different generator matrices representing that non-MDS code are used for different data stripes. By ensuring that the columns of the parity matrix are distributed evenly across the stripes, then the parity updates affect the stripes, and therefore the disks, about the same. Further, one may design an optimization scheme that minimizes the load imbalance between the stripes for a given systematic code C.

One embodiment of the improved technique is directed to a method of storing data in a redundant disk array in a storage system that employs a code which transforms an information vector of information symbols of length k into a codeword of code symbols of length n. The method includes constructing a set of l generator matrices, each generator matrix of the set of l generator matrices being compatible with the code and corresponding to a data stripe of the redundant disk array, l being at least 2. The method also includes generating a respective codeword for a given information vector by multiplying the given information vector by a particular generator matrix of the set of l generator matrices. The method further includes storing the respective codeword in a data stripe of the redundant array to which the particular generator matrix corresponds.

Additionally, some embodiments of the improved technique are directed to a system constructed and arranged to store data in a redundant disk array in a storage system that employs a code which transforms an information vector of information symbols of length k into a codeword of code symbols of length n. The system includes a network interface, memory, and a controller including controlling circuitry constructed and arranged to carry out the method of storing data in a redundant disk array in a storage system that employs a code which transforms an information vector of information symbols of length k into a codeword of code symbols of length n.

Furthermore, some embodiments of the improved technique are directed to a computer program product having a non-transitory computer readable storage medium which stores code including a set of instructions which, when executed by a computer, cause the computer to carry out the method of storing data in a redundant disk array in a storage system that employs a code which transforms an information vector of information symbols of length k into a codeword of code symbols of length n.

BRIEF DESCRIPTION OF THE DRAWING

The foregoing and other objects, features and advantages will be apparent from the following description of particular embodiments of the invention, as illustrated in the accompanying figures in which like reference characters refer to the same parts throughout the different views.

DETAILED DESCRIPTION

An improved technique involves assigning a different generator matrix to each data stripe of the redundant disk array such that all of the different generator matrices represent the same code. For example, when a k×n generator matrix G represents a linear code C, k being the block length and n the code length, then for any invertible k×k matrix P, the matrix G'=PG is also a generator that represents C. When C is a systematic code, then G consists of a k×k identity matrix representing payload data concatenated with a k×(n−k) parity matrix representing parity data. Matrices P represent row operations on G, and there exist matrices P such that G' has the columns of the identity matrix in locations other than that in G'.

Advantageously, the improved technique allows for load balancing in non-MDS codes when different generator matrices representing that non-MDS code are used for different data stripes. By ensuring that the columns of the parity matrix are distributed evenly across the stripes, then the parity updates affect the stripes, and therefore the disks, about the same. Further, one may design an optimization scheme that minimizes the load imbalance between the stripes for a given systematic code C.

Figure 1:
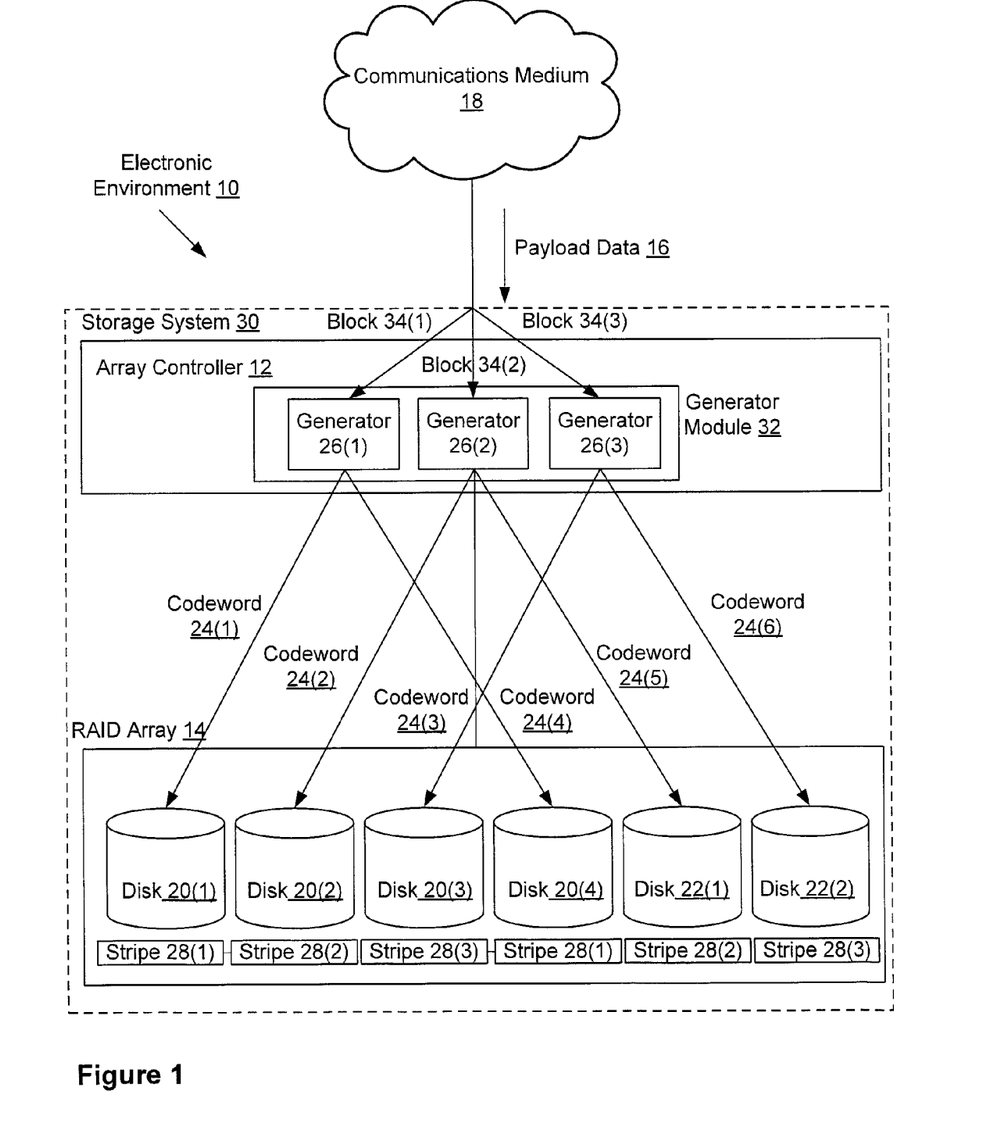
FIG. 1 is a block diagram illustrating an example electronic environment for carrying out the improved technique.

FIG. 1 illustrates an example electronic environment 10 for carrying out the improved technique. Electronic environment 10 includes storage system 30 which in turn includes array controller 12 and RAID array 14, and communications medium 18.

Communication medium 18 provides network connections between array controller 12 and storage system 30. Communications medium 18 may implement a variety of protocols such as TCP/IP, UDP, ATM, Ethernet, Fibre Channel, SCSI combinations thereof, and the like. Furthermore, communications medium 18 may include various components (e.g., cables, switches/routers, gateways/bridges, NAS/SAN appliances/nodes, interfaces, etc.). Moreover, the communications medium 18 is capable of having a variety of topologies (e.g., queue manager-and-spoke, ring, backbone, multi drop, point to-point, irregular, combinations thereof, and so on).

Array controller 12 is constructed and arranged to convert blocks of payload data 16 into various codewords 24(1), 24(2), . . . , 24(6) (codewords 24) according to generator matrices 26(1), 26(2), and 26(3) (generator matrices 26) in generator module 32. Array controller 12 is also constructed and arranged to send codewords to different disks 20 and 22 of RAID array 14 according to a predefined scheme. Array controller 12 is a server, although in some arrangements, array controller 12 may be a dedicated unit of a server, a personal computer, a laptop computer, or the like. Array controller 12 includes generator module 32.

Generator module 32 is constructed and arranged to generate codewords 24 from blocks of payload data 16 according to a predefined scheme, such as a round-robin scheme. Along these lines, generator module encodes a first block 34(1) of payload data 16 using generator matrix 26(1), a second block 34(2) of payload data 16 using generator matrix 26(2), a third block 34(3) of payload data 16 using generator matrix 26(3), and then subsequent blocks repeating through the generator matrices 26. Generator module 32 is typically software running on array controller 12, although in some arrangements, generator module 32 is a stand-alone piece of hardware.

RAID array 14 is constructed and arranged to store codewords 24 in payload disks 20 and parity disks 22 according to a prespecified scheme. RAID array 14 includes disks 20(1), 20(2), 20(3), and 20(4) (disks 20), and disks 22(1) and 22(2) (disks 22).

During operation, array controller 12 receives payload data 16 over communications medium 18. Payload data 16 is broken into blocks 34(1), 34(2), 34(3) (blocks 34) of length k; in some arrangements, array controller 16 breaks payload data into blocks 34. In turn, generator module 32 takes in block 34(1) and applies generator matrix 26(1) to it to create codeword 24(1) of length n. Analogously, generator module 32 applies generator matrix 26(2) to block 34(2) to create codeword 24(2) and generator matrix 26(3) to block 34(3) to create codeword 24(3). Generator module 32 applies generator matrices 26 to subsequent blocks of payload data 16 (not shown) in a round-robin fashion.

It should be understood that the code C underlying generator module 32 is, in this example, a systematic code. This implies that the generator matrices 26 include columns of a k×k identity matrix representing block 34 and columns of a k×(n−k) parity matrix representing parity data in codeword 24. Array controller 12 assembles generator matrices 26 such that the parity data in codeword 24 occupy different positions according to which generator matrix 26 generator module encodes blocks 34.

As an example to illustrate the above discussion, consider a (6,3,3) linear binary code with generator matrix 26(1):

$$G^{(1)} = \begin{pmatrix} 1 & 0 & 0 & 1 & 0 & 1 \\ 0 & 1 & 0 & 1 & 1 & 0 \\ 0 & 0 & 1 & 1 & 1 & 1 \end{pmatrix}$$

Here disks 1,2,3 are payload ones, and 4,5,6 are parity ones. One may verify that the following matrices 26(2) and 26(3), respectively, are also generator matrices for code C:

$$G^{(2)} = \begin{pmatrix} 1 & 1 & 1 & 1 & 0 & 0 \\ 1 & 0 & 1 & 0 & 1 & 0 \\ 0 & 1 & 1 & 0 & 0 & 1 \end{pmatrix}, \text{ and}$$

$$G^{(3)} = \begin{pmatrix} 1 & 0 & 1 & 0 & 1 & 0 \\ 0 & 1 & 0 & 1 & 1 & 0 \\ 0 & 1 & 1 & 0 & 0 & 1 \end{pmatrix}.$$

In $G^{(2)}$, disks 4,5,6 are payload, and 1,2,3 are parity; in $G^{(3)}$, disks 1,4,6 are payload and 2,3,5 are parity. It should also be understood that arbitrary arrangements of information symbols, i.e., payload data, within codewords 24 are not necessarily compatible with the code C. A constraint on the derived generator matrices is that, when the columns of the generator matrices 26 corresponding to parity data occupy a particular set of indices, the columns of nominal generator matrix 26(1) at that particular set of indices should be linearly independent. Such a set of indices in which linear independence of the columns in generator matrix 26(1) is achieved will be described below as an information set.

Array controller 12 then sends each codeword 24 to RAID array 14 to be stored in a particular stripe 28 in disks 20 or 22. In this example, array controller 14 stores those codewords that had been encoded with matrix 26(1) in stripe 28(1), those encoded with matrix 26(2) in stripe 28(2), and those encoded with matrix 26(3) in stripe 28(3). Further details of array controller 12 are described below with respect to FIG. 2.

Figure 2:
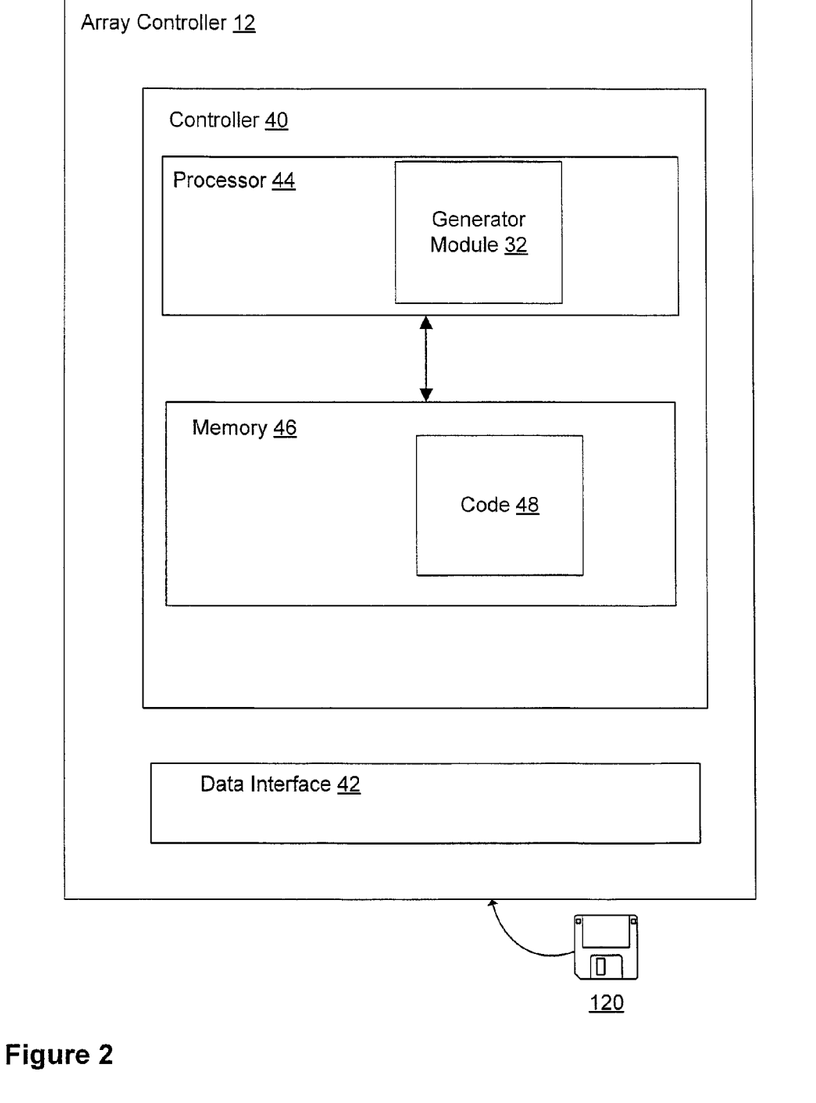
FIG. 2 is a block diagram illustrating an example array controller within the electronic environment shown in FIG. 1.

FIG. 2 illustrates details of an example array controller 12. Array controller 12 includes controller 40, which in turn includes processor 44 and memory 46, and data interface 42, such as SATA, SAS, Fiber Channel, etc.

Memory 46 is configured to store code 48 that contains instructions configured to cause processor 44 to carry out the improved technique. For example, for array controller 12, code 48 contains instructions for applying generator matrices 26 (see FIG. 1) to blocks 34. Memory 46 generally takes the form of, e.g., random access memory, flash memory or a non-volatile memory.

Processor 44 takes the form of, but is not limited to, ARM, Intel or AMD-based MPUs, and can include a single or multi-cores each running single or multiple threads. In some arrangements, processor 44 is one of several processors working together. Processor 44 is configured to carry out the improved technique by executing code 48. Processor 44 includes generator module 32, although in some arrangements, generator module 32 may be a stand-alone hardware module or software residing in memory.

It should be understood that the point of using the different generator matrices 26(1), 26(2), and 26(3) is to balance the load incurred through updating across stripes 28. Along these lines, suppose that $\rho$ is an update rate of information symbols. Suppose further that only the generator matrix 26(1) was being used over all stripes. Then a disk update rate, i.e., an update rate of the jth symbol of a codeword 24 is given by $$\lambda_j = \rho w_{1j},$$

where $w_{1j} \geq 1$ is the number of nonzero elements in the jth column of $G^{(1)}$. That is, with only a single generator matrix 26(1) for all blocks 34, the parity symbols in codewords 24 are updated more than the information symbols; because the parity and information symbols are stored in the same disks for every codeword, the disks 22 storing parity symbols are subject to much more wear than those 20 storing information symbols.

Taking into account the different generator matrices 26, however, the expression for the disk update rate becomes $$\lambda_j = \frac{\rho}{\ell} \sum_{l=1}^{\ell} w_{lj},$$

where $w_{lj} \geq 1$ is the number of nonzero elements in the jth column of $G^{(l)}$. Disk imbalance is now averaged over stripes 28. (In the case illustrated in FIG. 1, l=3.)

The effect of this averaging can be seen explicitly in the matrices illustrated above. For $G^{(1)}$ alone, the update rates for each codeword symbol is (1 1 1 3 2 1)$\rho$, while for the different generator matrices 26, the update rates become (4/3 5/3 2 5/3 5/3 4/3)$\rho$.

The latter update rates are more evenly distributed than the former update rates. There are any number of figures of merit to describe how evenly or unevenly update rates are distributed across disks 20 and 22, or stripes 28.

For example, consider the following figure of merit:

$$F(Q) = \sum_{j=1}^{n} |\lambda_j - \beta|,$$

where $\beta$ is the average update rate across the codeword symbols, and Q represents a particular family of collections of information sets that indicates the positions of the information symbols derived from each generator matrix. In the former case, the collection of information sets which is now called $Q_1$ has a figure of merit $F(Q_1) = 4\rho$. In the latter case, the collection of information sets which is now called $Q_2$ has a figure of merit $$F(Q_2) = \frac{10}{9}\rho.$$

Clearly, the figure of merit defined above is smaller when the load is more evenly distributed across the codeword symbols and, consequently, across the stripes.

The fact that a more balanced load is tied to a smaller figure of merit raises the question of an optimal load balance through minimization of F(Q) over a family of collections of information sets. Such an optimization scheme is described below with respect to FIG. 3.

Figure 3:
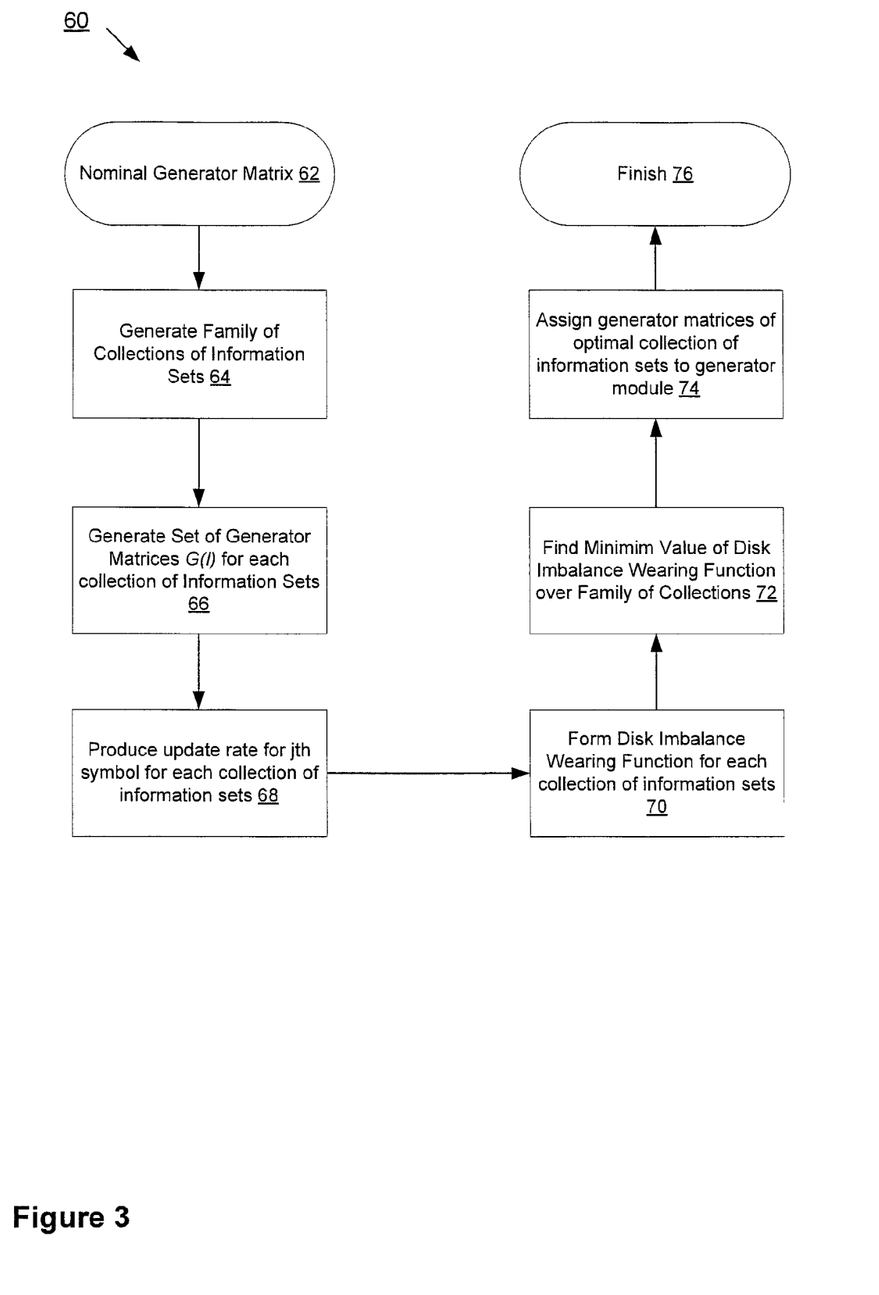
FIG. 3 is a flow chart illustrating an example optimization process within the electronic environment shown in FIG. 1.

FIG. 3 illustrates a process 60 for optimizing a load balance across codewords symbols, i.e. a family of information sets. Process 60 includes steps 62, 64, 66, 68, 70, 72, 74, and 76.

In step 62, processor 44 produces the nominal generator matrix, which is referred to as $G^{(1)}$ above. It is assumed that it is known how to generate this matrix, and nothing further need be discussed here.

In step 64, processor 44 generates a family of collections $Q_i$, $1 \leq i \leq T$, of information sets $I_l$, $1 \leq l \leq l$. In doing this, processor 44 builds each information set according to a process described in detail below with respect to FIG. 4.

In step 66, processor 44 generates a set of generator matrices $G^{(l)}$ corresponding to the information sets $I_l$, $1 \leq l \leq l$, belonging to a collection $Q_i$. In some arrangements, processor 44 generates a generator matrix from an information set $I_l$ using a gaussian elimination algorithm which is known in the those skilled in the art.

In step 68, processor 44 produces, for the collection $Q_i$, an update rate from the set of generator matrices $G^{(l)}$ according to $$\lambda_j = \frac{\rho}{\ell} \sum_{l=1}^{\ell} w_{lj}.$$

It should be understood that this update rate may have been computed as part of step 64, as will be discussed below with respect to FIG. 4.

In step 70, processor 44 forms the figure of merit $F(Q_i) = \sum_{j=1}^{n} |\lambda_j - \beta|$ as described above.

In step 72, processor 44 steps through the family of collections $Q_i$, $1 \leq i \leq T$ and chooses the collection $Q_{i_0}$ that minimizes F.

In step 74, processor 44 assigns the generator matrices of the optimal collection $Q_{i_0}$ of information sets to generator module 32 for converting blocks 34 into codewords 24.

Figure 4:
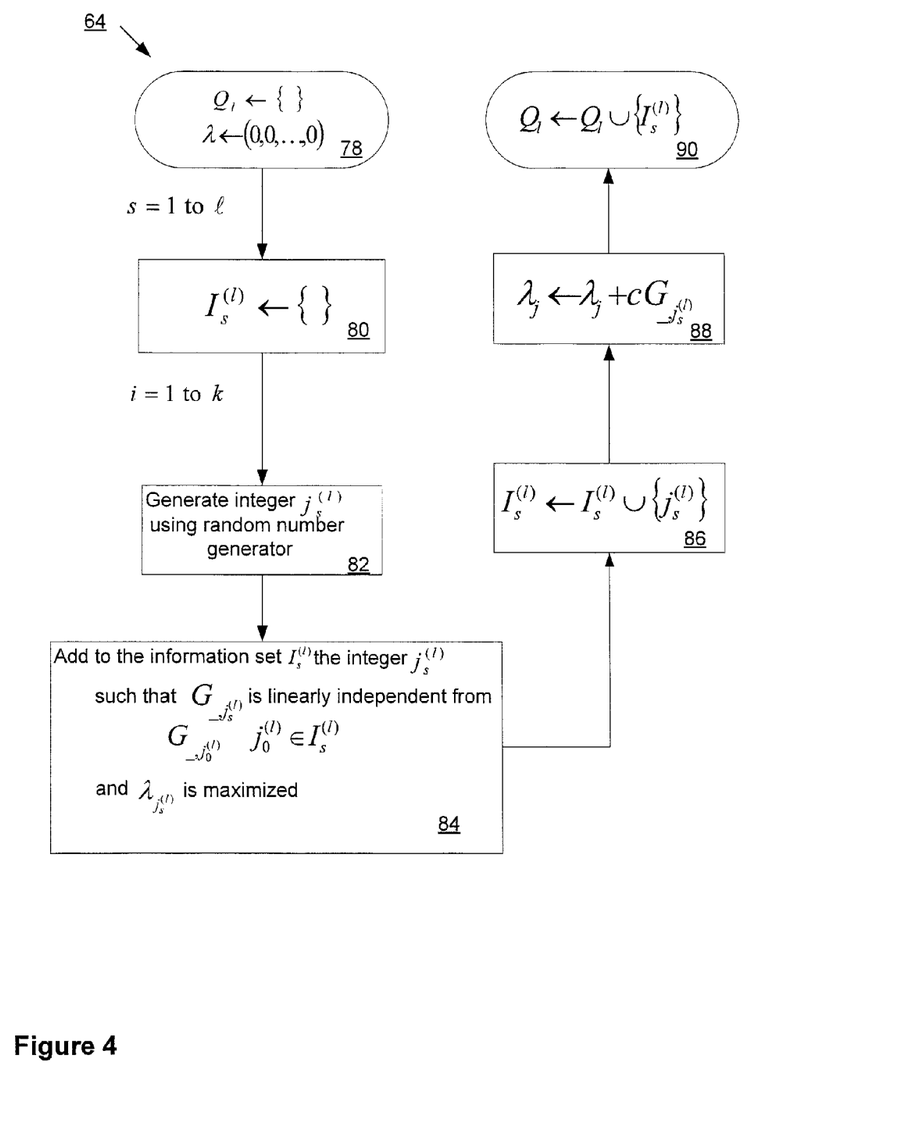
FIG. 4 is a flow chart illustrating further details of the example optimization process shown in FIG. 3.

FIG. 4 illustrates further detail of step 64 in which processor 44 creates a collection $Q_i$ of information sets from the nominal generator matrix. Step 64 further includes steps 78, 80, 82, 84, 86, 88, and 90.

In step 78, processor 44 initializes $Q_i$ and an array of update rates $\lambda_j$, $1 \leq j \leq n$. Processor 44 then loops over $1 \leq s \leq l$.

In step 80, processor 44 initializes each information set $I_s^{(l)}$ of the collection $Q_i$. Processor 44 then loops over $1 \leq i \leq k$.

In step 82, processor 44 runs a random number generation operation on $1 \leq j \leq n$ to produce an index $j_s^{(l)}$.

In step 84, processor 44 adds the index $j_s^{(l)}$ to information set $I_s^{(l)}$ such that two criteria are satisfied. The first criterion is that the column $$G^{(l)}_{-,j_s^{(l)}}$$

is linearly independent from the columns $$G^{(l)}_{-,j_0^{(l)}}$$

for each $j_o^{(l)} \in I_s^{(l)}$. The second criterion is that the update rate $$\lambda_{j_s^{(l)}}$$

is maximized.

In step 86, processor 44 appends the index $j_s^{(l)}$ to the information set $I_s^{(l)}$.

In step 88, processor 44 adds to the value of the update rates $\lambda_j$ a constant weighting factor c times the column $$G_{-,j_s^{(l)}}^{(l)}.$$

In step 90, once the information set $I_s^{(l)}$ is complete (i.e., the indices that define the information set are present), then processor 44 adds $I_s^{(l)}$ to collection $Q_l$ of information sets. This step finishes once the entire family of collections has been built in this way.

Figure 5:
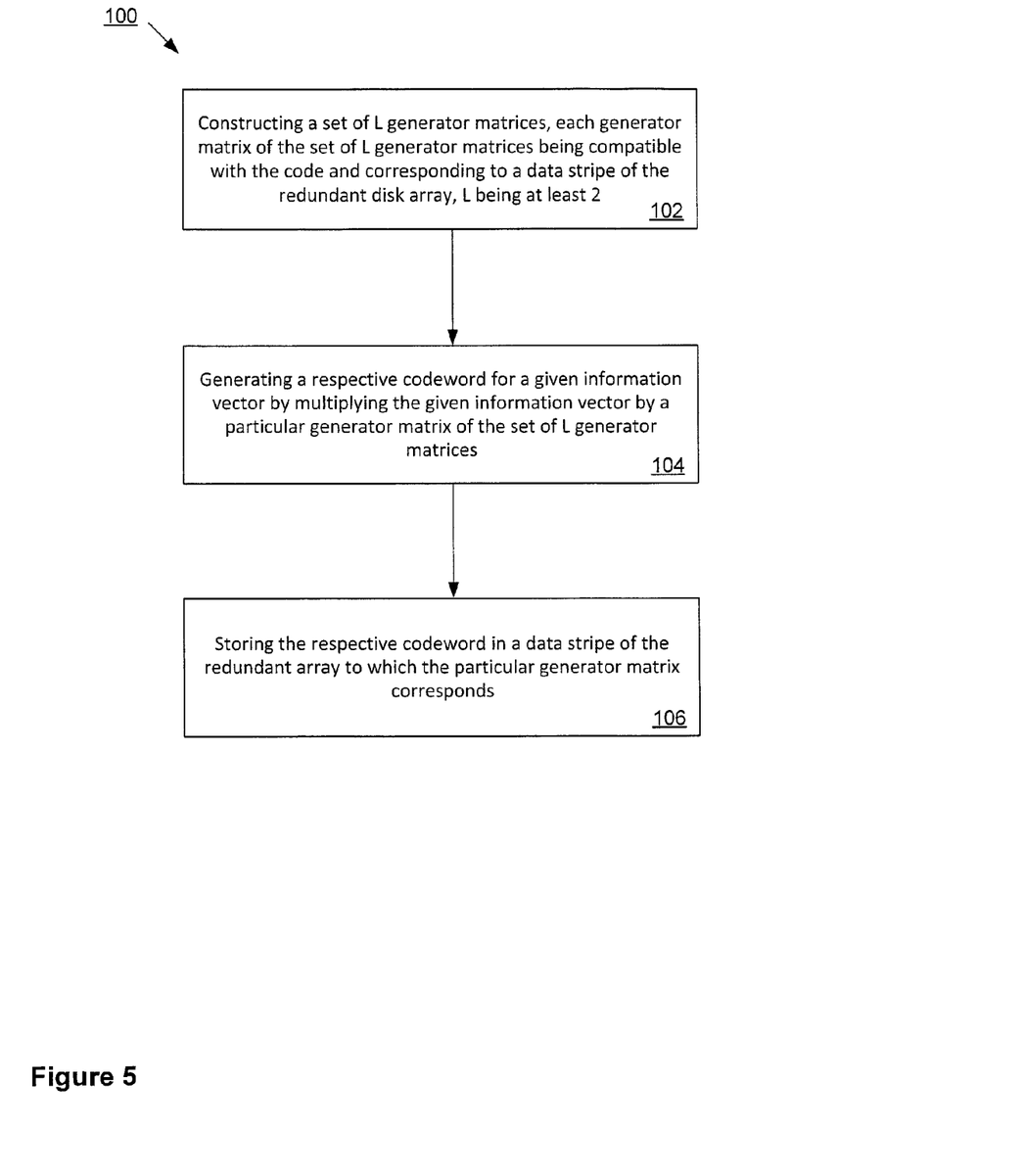
FIG. 5 is a flow chart illustrating an example method of carrying out the improved technique within the electronic environment shown in FIG. 1.

FIG. 5 illustrates a method 100 of storing data in a redundant disk array that employs a code which transforms an information vector of information symbols of length k into a codeword of code symbols of length n, including steps 102, 104, and 106. In step 102, a set of l generator matrices is constructed, each generator matrix of the set of l generator matrices being compatible with the code and corresponding to a data stripe of the redundant disk array, l being at least 2. In step 104, a respective codeword is generated for a given information vector by multiplying the given information vector by a particular generator matrix of the set of l generator matrices. In step 106, the respective codeword is stored in a data stripe of the redundant array to which the particular generator matrix corresponds.

While various embodiments of the invention have been particularly shown and described, it will be understood by those skilled in the art that various changes in form and details may be made therein without departing from the spirit and scope of the invention as defined by the appended claims.

For example, it should be understood that some embodiments are directed to array controller 12, which is constructed and arranged to update data stored on a redundant array of disks having an array controller in a storage system, each disk of the redundant array of disks including a disk controller apart from the array controller. Some embodiments are directed to a process of updating data stored on a redundant array of disks having an array controller in a storage system, each disk of the redundant array of disks including a disk controller apart from the array controller. Also, some embodiments are directed to a computer program product which enables computer logic to update data stored on a redundant array of disks having an array controller in a storage system, each disk of the redundant array of disks including a disk controller apart from the array controller.

It should also be understood that some embodiments are directed to array controller 2, which is constructed and arranged to store data in a redundant disk array that employs a code which transforms an information vector of information symbols of length k into a codeword of code symbols of length n. Embodiments are directed to a process of storing data in a redundant disk array that employs a code which transforms an information vector of information symbols of length k into a codeword of code symbols of length n.

In other arrangements, array controller 12 is implemented by a set of processors or other types of control/processing circuitry running software. In such arrangements, the software instructions can be delivered, within array controller 12, either in the form of a computer program product 120 (see FIG. 2) or simply instructions on disk or in pre-loaded in memory 46 of array controller 12, each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. In a storage system, a method of storing data in a redundant disk array that employs a code which transforms an information vector of information symbols of length k into a codeword of code symbols of length n, the method comprising:
   constructing a set of l generator matrices, each generator matrix of the set of l generator matrices being compatible with the code and corresponding to a data stripe of the redundant disk array, l being at least 2;
   generating a respective codeword for a given information vector by multiplying the given information vector by a particular generator matrix of the set of l generator matrices; and
   storing the respective codeword in a data stripe of the redundant array to which the particular generator matrix corresponds;
   wherein the code is a systematic code in which the codeword of length n contains the information vector of length k and a check symbol vector of check symbols of length n−k;
   wherein each generator matrix of the set of l generator matrices includes columns of a k×k identity matrix and columns of a k×(n−k) check matrix;
   wherein a nominal generator matrix is defined to be a generator matrix having k of its columns being columns of the k×k identity matrix; and
   wherein n is greater than k.

2. A method as in claim 1,
   wherein constructing the set of l generator matrices includes:
      for each generator matrix of the set of l generator matrices, distributing by elementary row operations the columns of the k×k identity matrix and the k×(n−k) check matrix within that generator matrix, columns of the nominal generator matrix which have positions of the columns of that generator matrix that are columns of the k×k identity matrix being linearly independent.

3. A method as in claim 2,
   wherein the method further comprises:
      prior to constructing the set of l generator matrices, constructing a collection of B information sets, each information set of the collection of l information sets corresponding to a generator matrix of the set of l generator matrices and being a set of positions of code symbols within a codeword.

4. A method as in claim 3,
   wherein distributing the columns of the k×k identity matrix and the k×(n−k) check matrix includes:
      performing a gaussian elimination operation on the nominal generator matrix, the gaussian elimination operation producing a generator matrix with columns of the k×k identity matrix having positions within the generator matrix being given by the information set of the collection of l information sets corresponding to the generator matrix.

5. A method as in claim 3, further comprising:
prior to distributing the columns of the k×k identity matrix and the k×(n−k) check matrix, forming a figure of merit indicative of an imbalance of a rate of updating symbols across the data stripes of the redundant disk array, the figure of merit being a function of a collection of information sets, the rate of updating symbols being indicative of a number of times a code symbol is used as an information symbol in the collection of information sets; and
performing an optimization operation on the figure of merit over a family of collections of information sets, the optimization operation producing an optimal collection of information sets;
wherein distributing the columns of the k×k identity matrix and the k×(n−k) check matrix includes:
for each information set of the optimal set of information sets, producing a generator matrix of the set of l generator matrices with columns of the k×k identity matrix having positions within the generator matrix being given by an information set of the optimal collection of information sets.

6. A method as in claim 5,
wherein forming the figure of merit includes:
forming a sum of an absolute value of a difference between the rate of updating symbols of a collection of information sets and a specified mean update rate over the collection of information sets, the sum being taken over each symbol of the codeword.

7. A method as in claim 5,
wherein performing the optimization operation on the figure of merit includes:
generating the family of collections of information sets;
finding the particular collection of information sets that minimizes the figure of merit over the family of collections of information sets, that particular collection of information steps being the optimal collection of information steps.

8. A method as in claim 7,
wherein generating the family of collections of information sets includes:
for each collection of the family of collections:
producing, with a random number generator, a collection of position indices, each position index of the collection of position indices corresponding to an information set of the collection of information sets;
for each position index of the collection of position indices:
producing a set of position indices with i) columns of the nominal generator matrix which have positions of the set of position indices being linearly independent and ii) the number of non-zero elements of those columns being maximized.

9. A method as in claim 8,
wherein the code has an alphabet that belongs to GF(2); and
wherein producing the set of position indices includes:
summing the columns of the nominal generator matrix to produce the number of nonzero elements of those columns being maximized.

10. An apparatus constructed and arranged to store data in a redundant disk array that employs a code which transforms an information vector of information symbols of length k into a codeword of code symbols of length n, the apparatus comprising:
a data interface;
memory; and
a controller including controlling circuitry, the controlling circuitry being constructed and arranged to:
construct a set of l generator matrices, each generator matrix of the set of l generator matrices being compatible with the code and corresponding to a data stripe of the redundant disk array, l being at least 2;
generate a respective codeword for a given information vector by multiplying the given information vector by a particular generator matrix of the set of l generator matrices; and
store the respective codeword in a data stripe of the redundant array to which the particular generator matrix corresponds;
wherein the code is a systematic code in which the codeword of length n contains the information vector of length k and a check symbol vector of check symbols of length n−k;
wherein each generator matrix of the set of l generator matrices includes columns of a k×k identity matrix and columns of a k×(n−k) check matrix;
wherein a nominal generator matrix is defined to be a generator matrix with k of its columns being columns of the k×k identity matrix; and
wherein n is greater than k.

11. An apparatus as in claim 10,
wherein the controlling circuitry constructed and arranged to generate the set of l generator matrices is further constructed and arranged to:
for each generator matrix of the set of l generator matrices, distribute by elementary row operations the columns of the k×k identity matrix and the k×(n−k) check matrix within that generator matrix, columns of the nominal generator matrix which have positions of the columns of that generator matrix that are columns of the k×k identity matrix being linearly independent.

12. An apparatus as in claim 11,
wherein the controlling circuitry is further constructed and arranged to:
prior to constructing the set of l generator matrices, access a collection of F information sets, each information set of the collection of l information sets corresponding to a generator matrix of the set of l generator matrices and being a set of positions of code symbols within a codeword and having been constructed offline.

13. An apparatus as in claim 12,
wherein distributing the columns of the k×k identity matrix and the k×(n−k) check matrix includes:
performing a gaussian elimination operation on the nominal generator matrix, the gaussian elimination operation producing a generator matrix with columns of the k×k identity matrix having positions within the generator matrix being given by the information set of the collection of l information sets corresponding to the generator matrix.

14. An apparatus as in claim 12,
wherein the controlling circuitry is further constructed and arranged to:
prior to distributing the columns of the k×k identity matrix and the k×(n−k) check matrix, forming a figure of merit indicative of an imbalance of a rate of updating symbols across the data stripes of the redundant disk array, the figure of merit being a function of a collection of information sets, the rate of updating symbols being indicative of a number of times a code symbol is used as an information symbol in the collection of information sets; and perform an optimization operation on the figure of merit over a family of collections of information sets, the optimization operation producing an optimal collection of information sets;

wherein distributing the columns of the k×k identity matrix and the k×(n−k) check matrix includes:

for each information set of the optimal set of information sets, producing a generator matrix of the set of l generator matrices with columns of the k×k identity matrix having positions within the generator matrix being given by an information set of the optimal collection of information sets.

15. An apparatus as in claim 14, wherein forming the figure of merit includes:

forming a sum of an absolute value of a difference between the rate of updating symbols of a collection of information sets and a specified mean update rate over the collection of information sets, the sum being taken over each symbol of the codeword.

16. An apparatus as in claim 14, wherein performing the optimization operation on the figure of merit includes:

generating the family of collections of information sets; and finding the particular collection of information sets that minimizes the figure of merit over the family of collections of information sets, that particular collection of information steps being the optimal collection of information steps.

17. An apparatus as in claim 16, wherein generating the family of collections of information sets includes:

for each collection of the family of collections:

producing, with a random number generator, a collection of position indices, each position index of the collection of position indices corresponding to an information set of the collection of information sets; and for each position index of the collection of position indices:

producing a set of position indices with i) columns of the nominal generator matrix which have positions of the set of position indices being linearly independent and ii) the number of nonzero elements of those columns being maximized.

18. An apparatus as in claim 17, wherein the code has an alphabet that belongs to GF(2); and wherein producing the set of position indices includes:

summing the columns of the nominal generator matrix to produce the number of nonzero elements of those columns being maximized.

19. A computer program product having a non-transitory, computer-readable storage medium which stores code for storing data in a redundant disk array that employs a code which transforms an information vector of information symbols of length k into a codeword of code symbols of length n, the code including instructions which, when executed by the disk controller, causes the disk controller to:

construct a set of l generator matrices, each generator matrix of the set of l generator matrices being compatible with the code and corresponding to a data stripe of the redundant disk array, l being at least 2;

generate a respective codeword for a given information vector by multiplying the given information vector by a particular generator matrix of the set of l generator matrices; and store the respective codeword in a data stripe of the redundant array to which the particular generator matrix corresponds;

wherein the code is a systematic code in which the codeword of length n contains the information vector of length k and a check symbol vector of check symbols of length n−k;

wherein each generator matrix of the set of l generator matrices includes columns of a k×k identity matrix and columns of a k×(n−k) check matrix;

wherein a nominal generator matrix is defined to be a generator matrix with its first k columns being the k×k identity matrix; and wherein n is greater than k.

20. A computer program product as in claim 19, wherein constructing the set of l generator matrices includes:

for each generator matrix of the set of l generator matrices, distributing the columns of the k×k identity matrix and the k×(n−k) check matrix within that generator matrix, columns of the nominal generator matrix which have positions of the columns of that generator matrix that are columns of the k×k identity matrix being linearly independent.

21. A method as in claim 1, wherein k is a number of information symbols in the vector of information symbols of length k and n is a number of code symbols in the codeword of code symbols.

\* \* \* \* \*